(12) United States Patent
Barnes et al.

(10) Patent No.: US 6,288,394 B1
(45) Date of Patent: Sep. 11, 2001

(54) HIGHLY CHARGED ION BASED TIME OF FLIGHT EMISSION MICROSCOPE

(75) Inventors: Alan V. Barnes, Livermore; Thomas Schenkel, San Francisco; Alex V. Hamza; Dieter H. Schneider, both of Livermore, all of CA (US); Barney Doyle, Albuquerque, NM (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/257,768

(22) Filed: Mar. 2, 1999

(51) Int. Cl.⁷ .............................. H01J 37/26; H01J 49/40
(52) U.S. Cl. ............... 250/309; 250/423 R; 250/492.3; 250/492.21; 250/281; 250/287; 315/111.81
(58) Field of Search .................. 250/309, 423 R, 250/492.3, 492.21, 281, 287; 315/111.81

(56) References Cited

U.S. PATENT DOCUMENTS 3,819,941 * 6/1974 Carrico ................................. 250/281
5,849,093 * 12/1998 Andra ................................... 134/1.3
6,002,128 * 12/1999 Hill et al. .............................. 250/287

* cited by examiner

Primary Examiner—Bruce Anderson
Assistant Examiner—Nikita Wells
(74) Attorney, Agent, or Firm—Alan H. Thompson; L. E. Carnahan

(57) ABSTRACT

A highly charged ion based time-of-flight emission microscope has been designed, which improves the surface sensitivity of static SIMS measurements because of the higher ionization probability of highly charged ions. Slow, highly charged ions are produced in an electron beam ion trap and are directed to the sample surface. The sputtered secondary ions and electrons pass through a specially designed objective lens to a microchannel plate detector. This new instrument permits high surface sensitivity ($10^{10}$ atoms/cm$^2$), high spatial resolution (100 nm), and chemical structural information due to the high molecular ion yields. The high secondary ion yield permits coincidence counting, which can be used to enhance determination of chemical and topological structure and to correlate specific molecular species.

13 Claims, 5 Drawing Sheets

HIGHLY CHARGED ION BASED TIME OF FLIGHT EMISSION MICROSCOPE

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to emission microscopes, and more specifically to a high spatial resolution microscope using slow, highly charged ions as the excitation source.

2. Description of Related Art

The need for highly sensitive surface analytical techniques has increased, particularly due to the demands of the semiconductor industry, which routinely operates at critical dimensions on the nanometer scale. A variety of instruments and techniques are available for high resolution lateral imaging of materials, such as transmission electron microscopy, scanning electron microscopy, scanning tunneling microscopy, and atomic force microscopy. In addition, many techniques are available to determine material composition of the imaged materials, including Auger electron spectroscopy, photoelectron spectroscopy, and secondary ion mass spectroscopy. Among the currently available techniques, secondary ion mass spectroscopy (SIMS) is highly favored because it offers in-depth information, low detection limits, and high depth resolution.

Emission microscopes, which are a special class of electron microscopes, accelerate and image low energy electrons and/or other charged particles emitted or reflected from a planar sample surface. One type of conventional emission microscope is an $Ar^+$ ion beam induced electron emission microscope, where the kinetic emission of electrons from the surface forms an image. In a second type of emission microscope, a secondary ion emission microscope, an ion beam of energetic singly charged ions is used to sputter secondary ions that are then imaged. It would be advantageous to combine the capabilities of both microscopes to image both electrons and the secondary ions, and to determine the mass of the secondary ions by time-of-flight (TOF) so that all of the secondary ions are detected simultaneously. An emission microscope for imaging and mass spectrometry to acquire spatially-resolved, compositional information with high sensitivity would have unique capabilities.

However, the use of singly charged ions for sputtering limits the technique due to the low secondary ion yield per incident ion. Most of the energy transferred to the sample surface comes from the kinetic energy of the projectile ion. Typically, the sputter yield is about 2–10 sample ions per incident ion, and the secondary ion yield per incident ion is often less than $10^{-2}$. The number of secondary ion counts per unit of sample consumption primarily determines the sensitivity limit.

The low secondary ion yield may be overcome by the use of highly charged ions for sputtering. The technique of SIMS using highly charged ions is described in a co-pending patent application (Ser. No. 09/227,997). The use of highly charged ions has many advantages, since these ions bring considerable energy to the sample surface which is released in a few femtoseconds of the surface interaction. This release causes highly localized energy deposition, which results in very high electron yields (hundreds of electrons per incident ion) and dramatically enhanced, high secondary ion yields (greater than one). The ratio of the secondary ion yield to the secondary neutral yield gives ionization probabilities of 10% for highly charged ion excitation. The high electron yield allows very high spatial resolution.

The present invention addresses the limitations of conventional emission microscopes by providing an emission microscope that images both electrons and secondary ions, and uses slow, highly charged ions as the sputtering source to achieve at least an order of magnitude greater sensitivity. The present invention provides highly sensitive compositional information at high spatial resolution.

SUMMARY OF THE INVENTION

The present invention is a high spatial resolution microscope using slow, highly charged ions as the excitation source. The present microscope images both electrons and secondary ions, and the mass of the secondary ions are determined by time-of-flight (TOF) so that all of the secondary ions are detected simultaneously. A large variety of contrast imaging modes are available. The highly charged ion source provides several advantages: a large secondary electron yield, high secondary ion yields, high ionization probability of the secondary emission, and high molecular ion yields. The high secondary ion yield, particularly the high secondary molecular ion yield, and the high ionization probability with highly charged ion excitation allows the present invention to achieve compositional information at high spatial resolution, although there is a trade-off between sensitivity and resolution. Depending on the information desired, either highly sensitive compositional information (about 0.1 ppm) can be achieved, or very high spatial resolution (about 10 nm).

The system comprises a ion source producing a primary ion beam of highly charged ions that are directed at a sample surface, and a mass analyzer and a detector of the emitted electrons and secondary ions that are sputtered from the sample surface after interaction with the primary beam. Highly charged ions create extreme densities of electronic excitations on surfaces; thus, yields of secondary ions per incident ion are increased by two to three orders of magnitude compared to singly charged ions, which allows a 10 to 100-fold improvement in the sensitivity of the quantitative surface analysis. Examples of highly charged ions include $Xe^{12-52+}$ and $Au^{44-69+}$.

The present invention further improves on standard emission microscopes by applying coincidence counting. The high secondary ion yield and the secondary ion emission from a small area make the coincidence technique very powerful. In coincidence counting, the secondary ion stops are detected in coincidence with a start signal, and there can be the additional requirement that a particular secondary ion is present. To detect secondary ions in coincidence with a required secondary ion on a practical time scale (e.g., minutes vs. hours), the secondary ion yield must be on the order produced by highly charged ions, i.e., 1–20 secondary ions per primary ion, in contrast with singly charged ions, which on average provide less than 0.01 secondary ions per primary ion. Highly charged ion excitation is well suited to coincidence time-of-flight techniques.

The present microscope offers extremely high mass resolution and mass accuracy for surface characterization and unambiguous identification of organic compounds and inorganic elemental contamination on surfaces. In particular, this microscope can be used to image and quantify metal trace contaminants and dopants on silicon wafer surfaces and other thin films. The present invention may be useful for determining particulate contamination present in semiconductor fabrication areas. The present invention has many other capabilities, including compositional imaging of corrosion features on metal surfaces with high sensitivities for all species present, imaging biological materials like DNA and other macromolecules for structural determination, and compositional and isotopic analyses of samples collected for environmental monitoring or forensic studies. Other objects and advantages of the present invention will become apparent from the following description and accompanying drawings.

BRIEF DESCRIPTION OF THE DRAWINGS

The accompanying drawings, which are incorporated into and form part of this disclosure, illustrate embodiments of the invention and together with the description, serve to explain the principles of the invention.

DETAILED DESCRIPTION OF THE INVENTION

Figure 1:
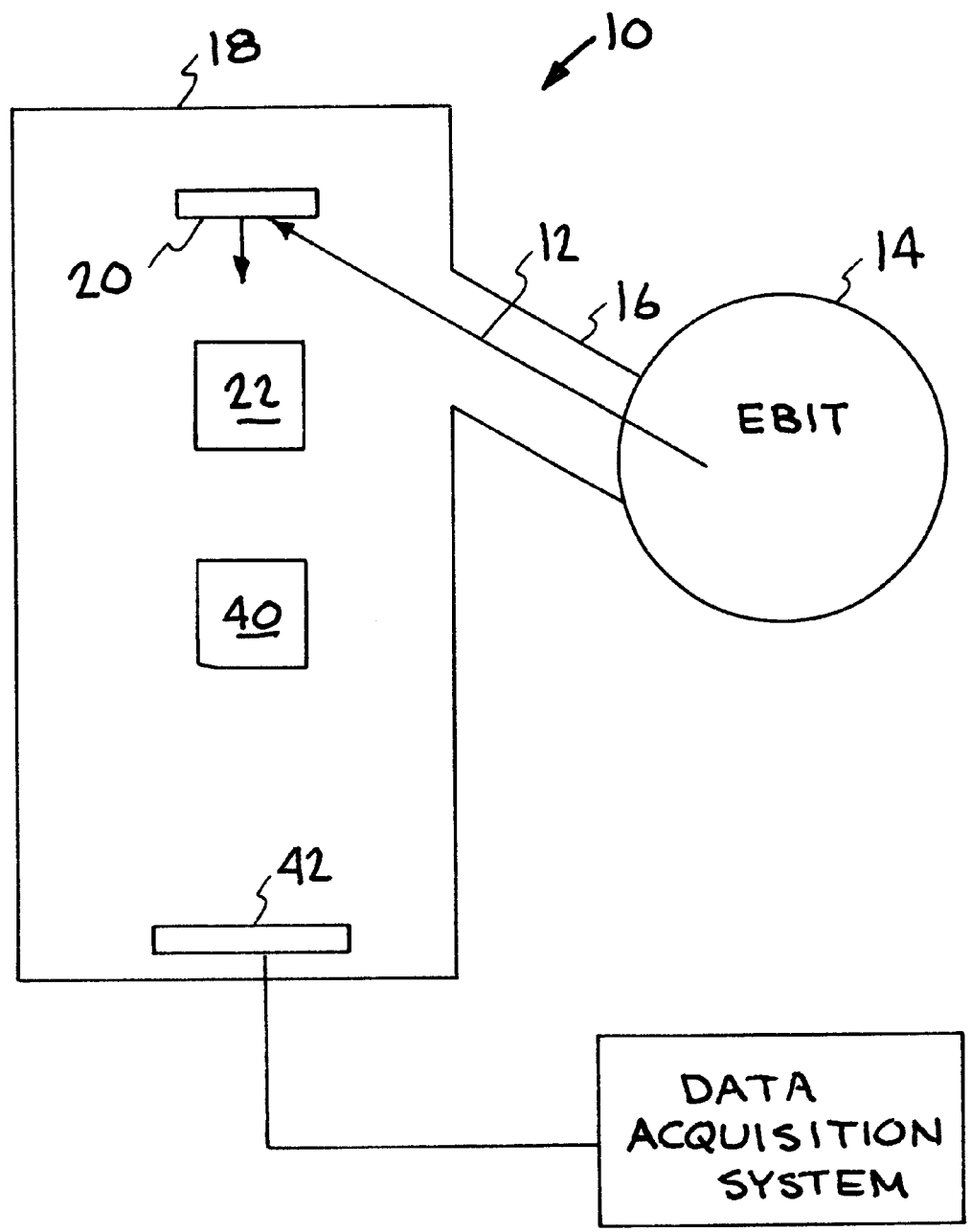
FIG. 1 shows a highly charged ion based time-of-flight emission microscope according to the present invention.

The present invention is a highly charged ion based time-of-flight emission microscope having high spatial resolution. A schematic of the microscope is shown in FIG. 1. The microscope 10 uses a low emittance beam 12 (e.g., <0.2 π mm mrad) of slow, highly charged ions extracted from an electron beam ion trap 14 (EBIT). The EBIT 14 is a compact (table top-sized) ion source developed at Lawrence Livermore National Laboratory, and is currently the only available ion source capable of producing beams of slow, very highly charged ions. The charge, mass, and energy of this primary beam can be varied independently.

Through the addition of ion extraction optics, the EBIT has developed into a versatile, novel ion source for slow velocity (about $10^5$ m/s) highly charged ions. Charge states of greater than one up to $80^+$ can be selected. The initial charge states of highly charged ions are much larger than the mean equilibrium charge states that correspond to their low velocities ($v \leq 0.3 v_{Bohr}$, $E_{kin} \leq 3$ keV/amu). Slow, highly charged ions are differentiated from fast ions of similar high charge states with velocities Of $V > v_{bohr}$, which are produced by charge state equilibration in gaseous or solid targets at relativistic energies (>100 MeV/amu). Highly charged incident ions have included the following: $O^{3,5,7+}$, $Xe^{12,15,16,20,21,24,25,27,28,30,32,35,36,40,44,48,51,52+}$, $Au^{44,48,52,56,58,60,64,69,+}$, $Ar^{16,18+}$, $Kr^{33+}$, and $TH^{44,48,52,54,58,59,62,65,66,69,70,73,75+}$.

Highly charged ions carry a large amount of potential energy (100–300 keV per incident ion) when they interact with a surface. Individual highly charged ions, such as $Xe^{44+}$ or $Au^{69+}$, deposit an unusually high density (about 1 $J/cm^2$ or $10^{14}$ $W/cm^2$ per ion) of electronic excitations onto a nanometer sized surface area in less than 10 femtoseconds ($10^{-14}$ s). This extreme, localized excitation leads to electronic sputtering of the surface.

Referring again to FIG. 1, the EBIT 14 produces a primary ion beam 12 of highly charged ions, which travel through a beamline 16 between the EBIT 14 and the microscope chamber 18. A mass analyzer with a 90° bending magnet in the beamline 16 is used to select the mass-to-charge ratio of the incident ion beam. The beam 12 is directed at a sample surface 20, causing the emission of electrons and sputtering of secondary ions from the sample after interaction with the beam 12. The use of highly charged ions (HCI) permits ultra-sensitive surface analysis and high spatial resolution simultaneously.

Secondary ions and electrons emanate from the sample 20, and are directed to an objective lens 22. In one embodiment, the sample plane is about 5 mm from the objective lens. The objective lens 22 is specially designed since the constraints are different from other emission microscope objective lenses. For this application, a highly charged ion beam must pass by the objective lens and impinge on the sample, and both secondary electrons and secondary ions are imaged. Imaging both electrons and ions present two opposing constraints, since a highly accelerating field at the sample is desired to collect secondary particles with minimal aberrations, and a very high accelerating field will deflect the primary HCI beam. The requirement to have identical focusing properties for ions of equal energies constrains the present design to an electrostatic lens.

Figure 2A:
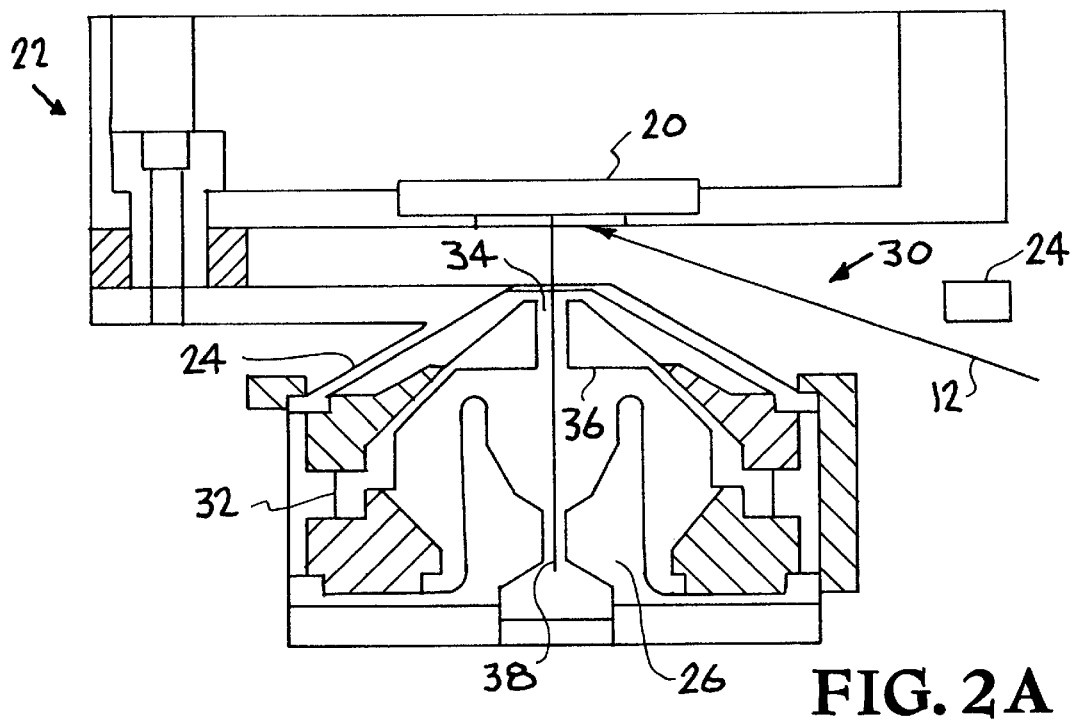
FIGS. 2A–2B show side and top views of an electrostatic accelerating objective lens according to the present invention.
Figure 2B:
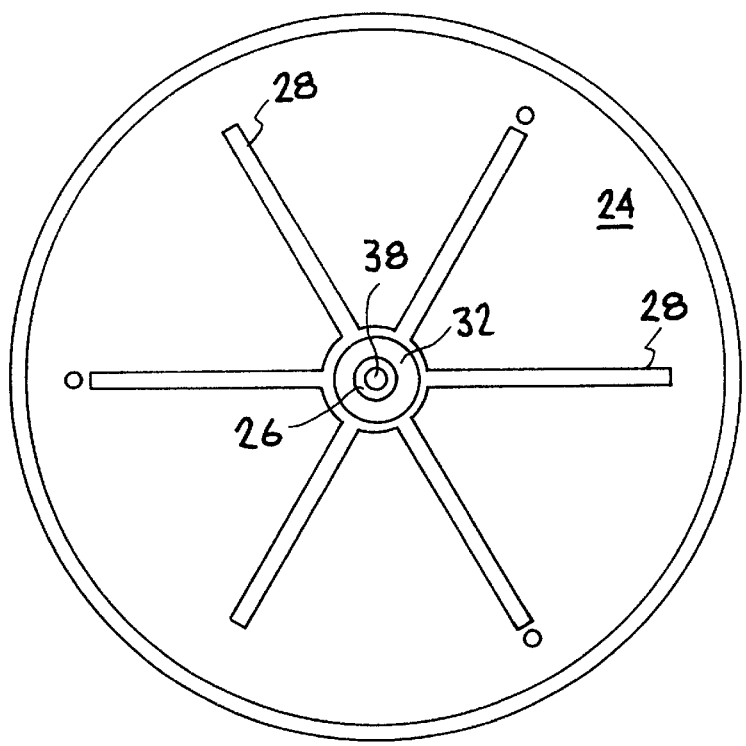

The resulting design of the electrostatic accelerating objective lens 22 is an "acorn" design, an embodiment of which is shown in the side and top views of FIGS. 2A and 2B. This design improves beam throughput and maintains high resolution. The microscope 10 operated with only the objective lens 22 has a magnification of about 40×. The sample 20 can be mechanically attached to the lens 22 (as shown) and is typically biased between –5 kV and +2 kV.

The illustrative embodiment of the objective lens 22 has three elements. The top element 24 and rear element 26 are held at ground potential. The top element 24 is shaped like a flat hollow cone and has six evenly spaced slots 28 in it, where one slot 30 is aligned such that the primary ion beam 12 can pass through the top element 24 to impinge on the sample surface 20 in the field-of-view.

A focusing element 32 reaches inside the top element 24 (to within 5 mm of the sample plane), and is typically biased from 0 to ±40 kV, and preferably in the range of 20–25 kV. The focusing element is cone-shaped, where the beam passes through a hole 34 at the top of the cone. The top of the cone around the hole is solid (with thicker walls), so the hole 34 is cylindrical. A potential is applied to the beam as it travels through this tubular hole. At the exit end of the hole, the element becomes hollow, forming a ledge or flat surface 36. The rear element 26 is bowl-shaped, where the beam passes through the sides of the bowl and then through a hole 38 in the bottom of the bowl, which is thicker. The cone shape of the focusing element and the bowl shape of the rear element form the "acorn" design.

The secondary electrons and ions are directed to one or more projection lenses 40, which may be about 200 mm from the sample plane 20, and then to a microchannel plate detector 42 (about 40 mm), which is about 460 mm from the sample plane 20. In one embodiment, a highly charged ion beam of 3 mm illuminates the entire one mm field-of-view.

Position sensitive detectors and an event mode data acquisition system capable of maintaining a 20 kHz data rate are used to produce images with high spatial resolution and compositional information. More specifically, microchannel plates with a resistive-anode readout were used to record the position of the electrons and the ions arriving at the microscope image plane.

The electronically sputtered ions are detected by time-of-flight (TOF) mass spectrometry, where the mass-to-charge ratios of the secondaries are determined by the flight time from the sample surface to the microchannel plate detector. Very high time resolution (<1 ns) is achieved by "single ion triggering" on the emitted electron pulse (as high as 200 electrons per ion for $Au^{69+}$) and stopping the time-to-digital converter with the secondary ion pulses.

Surface analysis is accomplished by determination of the mass and quantity of the elemental and molecular secondary ions removed from the sample. (Secondary ions containing more than one atom are referred to as molecular ions.) The relationship between the signal intensity and the composition of the surface is determined by the relative sensitivity factor between the secondary ion in question and the sample ions.

The high secondary ion emission and yield from a small area as a result of using highly charged ions permit the use of coincidence counting, where the secondary ion stops are detected in coincidence with a start signal. The presence of a particular secondary ion may be added as a requirement. To detect secondary ions in coincidence with a required secondary ion, the secondary ion yield must be on the order produced by HCI-SIMS, i.e., 1–20 secondary ions per primary ion, in contrast with conventional SIMS, which on average provides less than 0.01 secondary ions per primary ion. Highly charged ion excitation is well suited to coincidence time-of-flight secondary ion emission microscopy.

The secondary yields are measured using TOF-SIMS. Fluxes of <1000 ions per second may be used, where each TOF-SIMS cycle is triggered by secondary particles emitted from the sample by the impact of an individual HCI under normal incidence. Typical accumulation times for the TOF-SIMS spectra are about ten minutes.

The electronics recorded data records for each event containing the pulse heights from the detector for the start (electron secondaries) and stop (ion secondaries), as well as the time interval between the start and stop. Images are constructed by a variety of post-processing procedures known in the art. For example, images may be constructed by displaying the pulse height of the start (electron) pulse (color look-up table) as a function of the x-y position, with or without requiring certain secondary ion filters. Images can also be displayed using the x-y position from the start pulse, and a color for the time of arrival of the stop. In addition, time-of-flight spectra from all the events or from events in a particular region can be displayed.

Using the position information to relax the rate limitations set by pile-up places new demands on the data acquisition system. Time and image data from the position sensitive detector must be digitized at the highest achievable rate to produce a string of time, pulse height, and position records. These records are then associated into individual ion interactions based on their spatial and temporal proximity. The resultant ion events are then recorded as mass spectral data in the appropriate pixels for the images desired.

Conventional SIMS system are limited to imaging a single mass at a time. The present invention avoids this problem by using a uniform illumination and using only events with multiple secondaries, which is virtually all events for HCI interactions. The optics focus all the secondaries from an event to the same spot on the detector, so one can require events to have all their ions in the same location. This allows secondaries from several events in the spectrometer at the same time with no confusion about which secondary goes with which event. Assuming reasonable detector resolutions, this approach reduces the background significantly and results in increased sensitivity.

In the case of imaging negative ions, the highly charged ions produce an intense electron emission with over 100 electrons emitted, and several secondary ions emitted from the same location on the sample. Using data processing, each electron and secondary ions that hits the detector is tracked. The ions are associated with the electron bursts using the position information from the detector, and these data are combined with data from other events in the same pixel. Thus, a time-of-flight spectrum is accumulated for each pixel in the image. The background decreases as the square of the ratio of the detector diameter to its resolution, so even a wedge and strip channel plate detector with a modest 0.1 mm ion spatial resolution device can reduce the pile-up related background by five orders of magnitude. This multiple hit for each event permits the application of time-of-flight to dynamic SIMS.

Figures 3A, 3B:
FIGS. 3A–3B show images collected using a highly charged ion based TOF emission microscope.

FIGS. 3A–3B depict images collected using the present invention from different samples using a selected contrast mode. FIG. 3A is an image (with magnification 40×) of molybdenum electroformed mesh embedded in plastic. The molybdenum mesh had lines separated by 254 microns with 38 microns width. The contrast in the image indicates the number of electron emission events; the highest number of events occurs in the mesh wire, and the lowest number of events occurs in the plastic. The depletion in the number of observed events in the plastic regions near the mesh wires is caused by a charging of the plastic substrate deflecting the secondary ions and electrons from the detector. Although the contrast in these figures is shown in shades of gray, it is preferable to show contrast in different colors.

FIG. 3B is an image of tungsten plugs surrounded by silicon dioxide on a silicon wafer. The tungsten plugs are 4 microns in diameter. There are two tungsten plugs separated by 4 microns vertically in the image, which are unresolved. The second column of tungsten features are 8 microns width by 12 microns length, which are resolved. The magnification in this image is 500×, which is achieved with an additional electrostatic projection lens. The color contrast in this image is based on the number of emitted electrons per emission event. The light areas correspond to large number (~100) of electrons emitted per pulse, and the dark areas correspond to few (~50) electrons emitted per event. The tungsten areas emit more electrons per highly charged ion impact than the silicon dioxide.

Images have also been collected using a different contrast mode, where the contrast in the image corresponds to the type of secondary ion observed by time-of-flight. For example, one color corresponds to long times, such as heavier ions (e.g., $WO_3^-$), and another color corresponds to shorter flight times such as $SiO_3^-$.

Figure 4A:
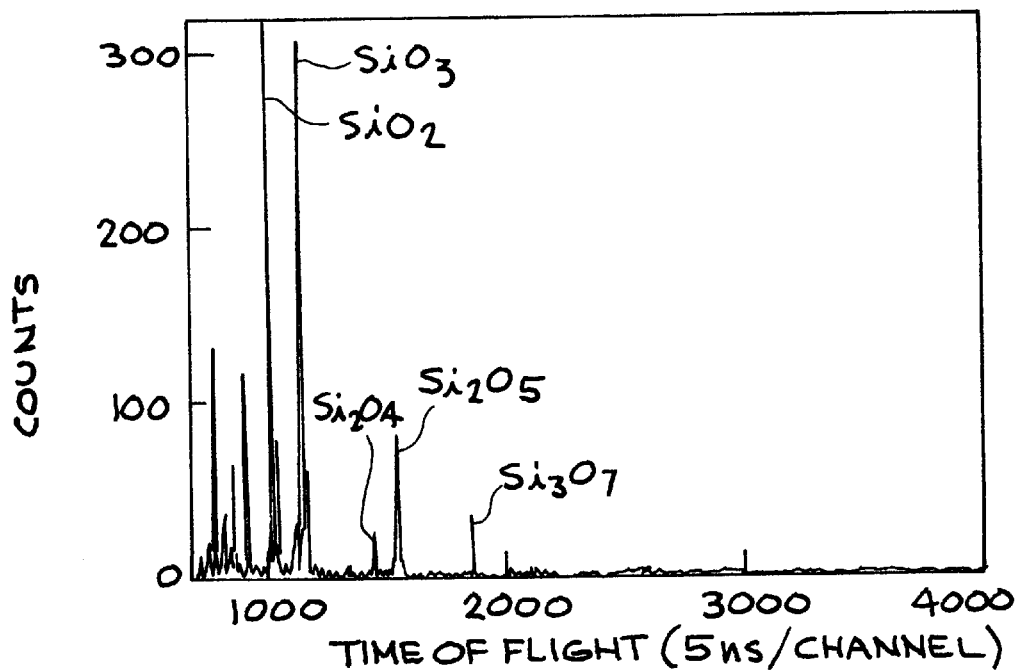
FIGS. 4A–4B show TOF spectra of compositionally different materials.
Figure 4B:
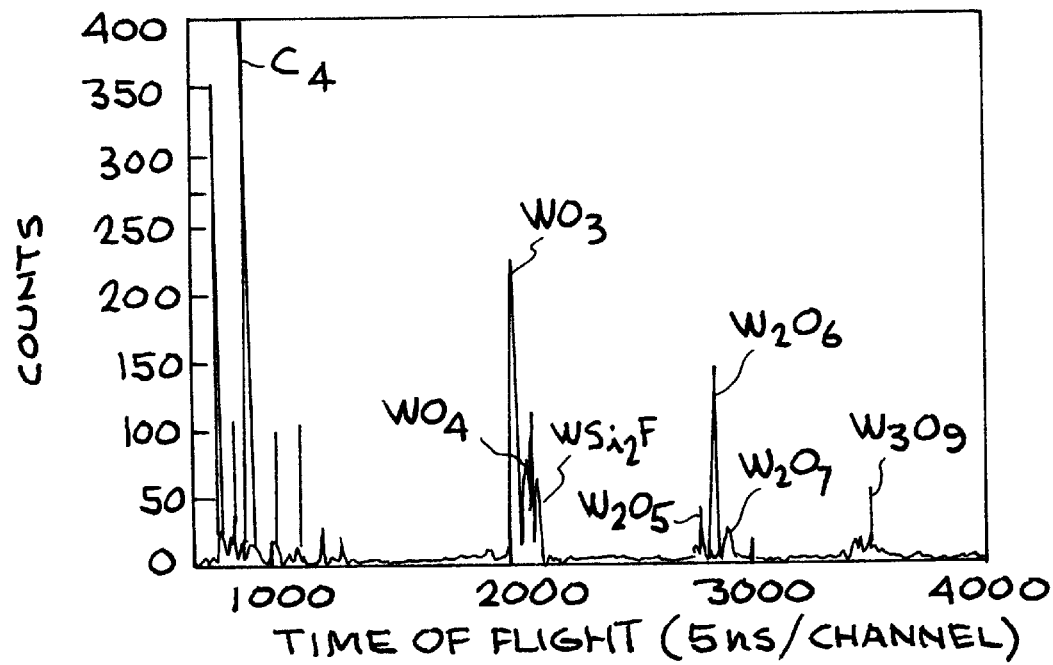

The image in FIG. 3B reveals two significantly different material regions: tungsten-related regions and $SiO_2$ regions. By selecting events from these regions, one can provide a spatially resolved analysis of the composition. FIG. 4A shows a time-of-flight spectrum of a $SiO_2$ region, while FIG. 4B is a spectrum from a tungsten region. FIG. 4A shows the characteristic mass peaks associated with $SiO_2$, while the plot in FIG. 4B is dominated by tungsten oxide clusters.

Figure 5:
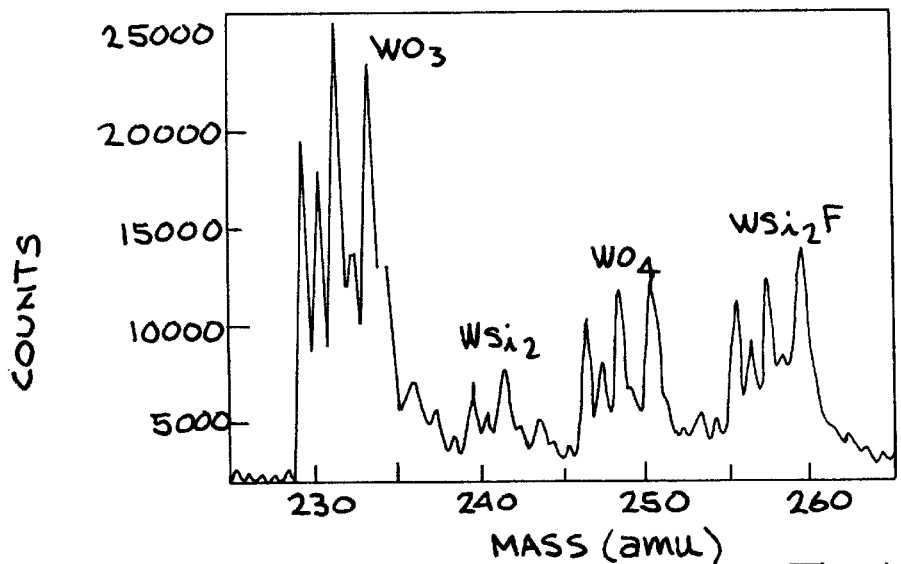
FIG. 5 shows a TOF spectrum from a tungsten oxide region.

FIG. 5 shows a time-of-flight spectrum (counts vs. mass) from the microscope of the present invention, taken with a picosecond time analyzer while accumulating an image. The image was taken in the $WO_3^-$ region, demonstrating greater than one AMU mass separation out to mass 260. The isotopes of tungsten are clearly resolved in the tungsten oxide lines at masses out to 260 AMU (182 26%; 183 14%; 184 31%; 186 28%).

Figure 6:
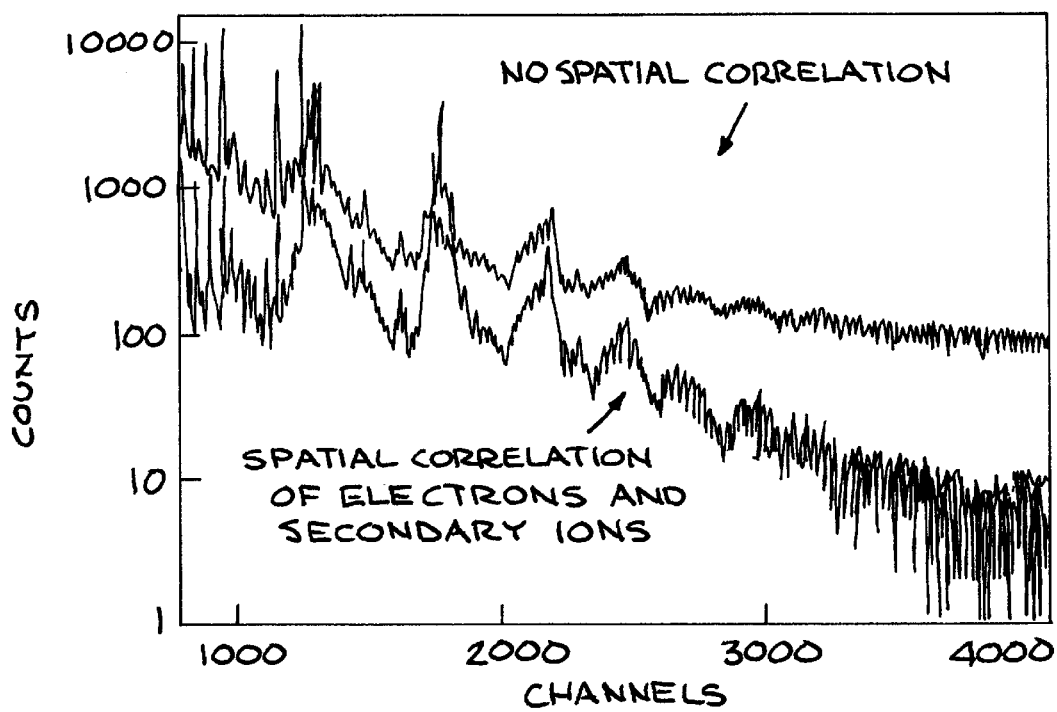
FIG. 6 shows TOF spectra for all events and for events where secondary ion arrival is correlated with the electron pulse.

Substantial background suppression can be achieved by eliminating uncorrelated stop events from the time-of-flight spectrum. Selected events are required to have all their ions in the same location. This allows secondaries from several events in the spectrometer at the same time with no confusion about which secondary goes with which event. FIG. 6 illustrates the rejection of "pile-up" background by only selecting events whose secondary ions arrive in the same location as the secondary electrons. FIG. 6 is a time-of-flight spectrum for all events from the wafer (gray line) and for events where the secondary ion arrival is spatially correlated with the electron pulse (black line).

FIG. 6 shows the increase in the signal-to-noise ratio for the secondary ion mass spectrum of nearly an order of magnitude. In principle, the primary beam intensity could be increased by this amount, enabling images of a ten micron region with ten nanometer resolution to be acquired in a few seconds. In practice, the bandwidth limitations of the position sensing devices will allow only a three order of magnitude improvement in collection times, but the increased sensitivity due to reduced pile-up background is beneficial.

The foregoing description of preferred embodiments of the invention is presented for purposes of illustration and description and is not intended to be exhaustive or to limit the invention to the precise form disclosed. Many modifications and variations are possible in light of the above teaching.

What is claimed is:

1. A highly charged ion based time-of-flight emission microscope, comprising:
    a beam source comprising an electron beam ion trap for producing a primary ion beam of highly charged ions, wherein the beam is directed at a sample surface to cause emission of charged particles, including sputtered secondary ions, from the sample surface;
    an accelerating lens for focusing the charged particles toward an image plane;
    a mass analyzer into which are introduced the sputtered secondary ions; and
    a detector of the charged particles at the image plane for producing an image of the sample surface.

2. A microscope as recited in claim 1, wherein the detector detects sputtered secondary ions in coincidence with a start signal.

3. A microscope as recited in claim 1, wherein the detector detects the sputtered secondary ions in coincidence with a selected secondary ion.

4. A microscope as recited in claim 1, wherein the detector detects secondary ions and electrons simultaneously.

5. A microscope as recited in claim 1, wherein the detector detects the intensity of electron emission, whereby the image has contrast based on intensity of electron emission.

6. A microscope as recited in claim 1, wherein the detector detects the presence of secondary ions, whereby the image has contrast based on the presence of selected secondary ions.

7. A microscope as recited in claim 1, wherein the detector detects the presence of secondary ions and intensity of electron emission, whereby the image has contrast based on intensity of electron emission and the presence of selected secondary ions.

8. A microscope as recited in claim 1, wherein the detector detects the presence of secondary ions and intensity of electron emission, whereby the image is produced using selected secondary ions that arrive in the same location on the detector as electrons.

9. A microscope as recited in claim 1, wherein the accelerating lens is an electrostatic accelerating objective lens comprising a cone-shaped focusing element having a top and a bottom, wherein the walls at the top of the cone are thicker than the walls at the bottom, and the beam passes through a hole in the top of the cone and exits through the bottom.

10. A microscope as recited in claim 9, wherein the accelerating lens further comprises a bowl-shaped grounded element having a top and a bottom, wherein the beam passes through the sides of the bowl and exits through the bottom of the bowl after passing through the focusing element.

11. A microscope as recited in claim 10, wherein the accelerating lens further comprises a cone-shaped grounded element, wherein the beam passes through the cone-shaped element before passing through the focusing element.

12. A microscope as recited in claim 1, further comprising at least one projection lens situated between the accelerating lens and the detector.

13. A microscope as recited in claim 1, wherein the primary beam produces highly charged ions having a charge state greater than one.

* * * * *